United States Patent [19]

Edel

[11] Patent Number: 4,568,918
[45] Date of Patent: Feb. 4, 1986

[54] KEYSWITCH WITH DECOUPLING DIODE

[75] Inventor: Bernhard Edel, Munich, Fed. Rep. of Germany

[73] Assignee: Siemens Aktiengesellschaft, Berlin & Munich, Fed. Rep. of Germany

[21] Appl. No.: 619,935

[22] Filed: Jun. 12, 1984

[30] Foreign Application Priority Data

Jun. 29, 1983 [DE] Fed. Rep. of Germany ....... 3323463

[51] Int. Cl.$^4$ .............................................. H01H 3/12
[52] U.S. Cl. ............................... 340/365 E; 200/5 A; 200/159 B
[58] Field of Search .......... 340/365 E, 815.13, 815.14, 340/815.12, 365 L, 365 R; 200/314, 159 R, 159 B, 5 A

[56] References Cited

U.S. PATENT DOCUMENTS 4,012,608 3/1977 Lockard ............................ 200/16 D
4,115,673 9/1978 Smith .................................. 200/315

OTHER PUBLICATIONS

"Selecting the Right Keyboard", Eikelberger, Machine Design, Nov. 12, 1981, pp. 68–73.

Primary Examiner—J. R. Scott
Assistant Examiner—Morris Ginsburg
Attorney, Agent, or Firm—Hill, Van Santen, Steadman & Simpson

[57] ABSTRACT

A keyswitch for use with keyboards for connecting intersecting row and column wires of a circuit board for the keyboard has a decoupling diode for preventing the generation of false signals which may prevent a clear identification of the keyswitch which has been activated upon the simultaneous actuation of several keyswitches. The decoupling diode is integrated in the movable contact bridge of the keyswitch so that no soldering need be undertaken on the circuit board for the keyboard.

7 Claims, 4 Drawing Figures

4,568,918

KEYSWITCH WITH DECOUPLING DIODE

BACKGROUND OF THE INVENTION

1. Field of the Invention

The present invention relates to keyswitches for use with keyboards having a matrix of row and column wires, and in particular to such a keyswitch which prevents the generation of false signals, but permits the circuit board for the keyboard to be manufactured without the necessity of soldering components thereto.

2. Description of the Prior Art

In keyboards comprising a plurality of keyswitches actuatable by means of depressable keys, each depressed key must be clearly electronically identifiable even if several keys are simultaneously actuated. In many keyboards, the keyswitches are respectively associated with intersection points of row wires and column wires of a wiring plate or circuit board having printed connectors disposed in a matrix, in order to maintain the number of exterior terminal connections as small as possible.

Upon depression of a key, a row wire is connected with the column wire disposed at the point of intersection beneath the key. In order to prevent the generation of false signals, so-called sneak paths, which may result upon the simultaneous actuation of several keys and which can cause erroneous identification of a non-depressed key, conventional keyboards employ decoupling diodes which are connected in series with the switching paths of the keyswitches. Such a keyboard is disclosed, for example, in "Selecting the Right Keyboard," Eikelberger, Machine Design, Nov. 12, 1981, pages 68-73. The decoupling diodes are connected to the circuit board of the keyboard, and require two solder points per keyswitch.

The elastomeric keyboards are also known in the art wherein a flexibile rubber-like sheet or mat having contact fields arranged thereon in a matrix grid corresponding to the arrangement of the keys on the keyboard are known in the art. The contact fields are linearly offset relative to each other and the sheet possesses elastically deformable, bubble-type raised portions. On the underside of the raised portion, contact plates are mounted which short circuit two adjacent contact points on the wiring plate or circuit board, which are respectively connected with a row wire and a column wire, when a key above the particular raised portion is depressed.

The use of elastomeric deformable keyboards makes possible the production of solder-free keyboards if decoupling diodes are not used. The use of decoupling diodes in combination with such keyboards, however, still requires soldering to the circuit board.

SUMMARY OF THE INVENTION

It is an object of the present invention to provide a keyswitch arrangement employing decoupling diodes which does not require any soldering to be done to the circuit board of the keyboard.

The above object is inventively achieved in an elastomeric keyswitch wherein the decoupling diode for each switch is integrated in the movable parts of the switching contacts of the keyswitches.

DESCRIPTION OF THE PREFERRED EMBODIMENTS

Figure 1:
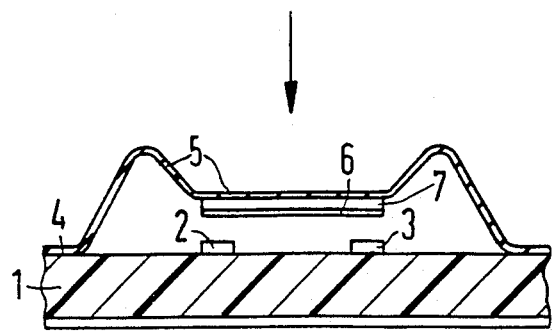
FIG. 1 is a sectional view of a keyswitch constructed in accordance with the principles of the present invention.

A portion of a wiring plate or printed circuit board 1 of a keyboard is shown in section in FIG. 1. The circuit board 1 has a contact pad 2 connected with a row wire and a contact pad 3 connected with a column wire of a standard matrix wiring field, not shown in greater detail. An actuator for the keyswitch in the form of a flexible deformable elastomeric sheet 4 comprised of rubber-like material is disposed above the circuit board 1. At each contact location, the sheet 4 has a raised portion 5, also shown in section in FIG. 1. As in conventional elastomeric keyswitch arrangements, a movable contact bridge 6 is disposed on the underside of the inner regions of the raised portion 5. The contact bridge 6 is in the form of a metal plate or carbon plate and each contact bridge 6 for each keyswitch respectively interconnects the two associated contact pads 2 and 3 if the raised portion 5 is depressed in the direction of the vertical arrow. Such depression may occur, for example, with the aid of a non-illustrated key disposed above the raised portion 5.

In accordance with the principles of the present invention, the contact bridge 6 is not homogenous but rather consists of a hybrid plate having a conductive contact surface disposed at its two ends in registry with the contact pads 2 and 3. A semiconductor diode is disposed between those contact surfaces and is electrically connected thereto. Upon depression of a key, a connection will thus be made between a row wire and a column wire through the decoupling diode. In order to reduce risk of fracture, the hybrid plate 6 is preferably mounted on an insulating carrier plate 7.

The contact bridge 6 may also consist of a silicon plate, also preferably disposed on a carrier of sufficient strength. The diode is formed, such as, for example, by monolithic integration, in the center region of the silicon plate and the exterior regions of the silicon plate are metallized or have a layer of polysilicon.

Figure 4:
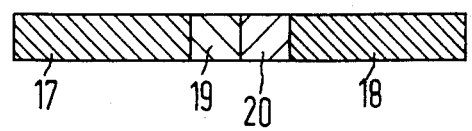
FIG. 4 is a cross-section of a further embodiment of a contact bridge of a keyswitch constructed in accordance with the principles of the present invention.

Another embodiment of the contact bridge 6 shown in FIG. 4 has two flat cubic members 17 and 18 of conductive material which form the contact surfaces. The decoupling diode is disposed between the opposite end faces of the members, with the p-doped semiconductor layer, for example 19, of the diode bordering the end face of one member and the n-doped semiconductor layer, for example 20, of the diode bordering the end face of the other member. The entire arrangement is again cemented onto a carrier plate for sturdiness.

Figure 2:
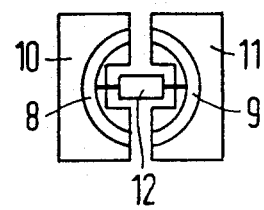
FIG. 2 is a plan view of a further embodiment of a contact bridge of a keyswitch constructed in accordance with the principles of the present invention.

Another embodiment of a contact bridge constructed in accordance with the principles of the present invention is shown in FIG. 2 wherein two substantially semicircular contact surfaces 8 and 9 are disposed on respective spacers 10 and 11. A commercially available miniature diode 12 is interconnected between the surfaces 8 and 9 with axial connecting wires.

Figure 3:
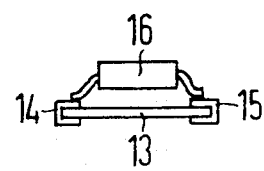
FIG. 3 is a side view of another embodiment of a keyswitch constructed in accordance with the principles of the present invention.

A further embodiment of a contact bridge constructed in accordance with the principles of the present invention is shown in FIG. 3, wherein two oppositely disposed edges of an insulating carrier 13 are surrounded or clad by U-shaped contact bars 14 and 15. The lower legs of the contact bars 14 and 15 function as the contact surfaces for the contact bridge. A diode 16 is connected to the respective upper legs of the contact bars 14 and 15 of the type utilized for film circuits.

It is also possible within the inventive concept disclosed herein, in the case of diodes having axial connecting wires, to squeeze or flatten the connecting wires so a to widen the wires and to mount the wires by means of spacers on the underside of the raised portion 5 of the elastomeric sheet 4. The flattened connecting wires thus form the contact surfaces in registry with the contact pads 2 and 3.

Moreover, small metal plates or short wire pieces may be welded onto the connecting wires of a diode extending perpendicularly to the connecting wires, the wire pieces or metal plates thus functioning as the contact surfaces in registry with the contact pads 2 and 3.

Although other modifications and changes may be suggested by those skilled in the art it is the intention of the inventor to embody within the patent warranted hereon all changes and modifications as reasonably and properly come within the scope of his contribution to the art.

I claim as my invention:

1. In an actuator in a keyswitch formed by a keyboard having a matrix of intersecting row wires and column wires disposed on a circuit board, one said actuator being disposed at each point of intersection between a row wire and a column wire for making a connection therebetween upon depression of said actuator, said actuator having an elastomeric sheet with a contact bridge carried on an underside thereof for making an electrical connection between a row wire and a column wire upon actuation of said keyswitch, the improvement comprising:

a decoupling diode integrated in said contact bridge and disposed for making a series connection between said row wire and said column wire upon depression of said actuator for preventing generation of a false contact signal upon the simultaneous actuation of more than one actuator.

2. The improvement of claim 1 wherein said row wire has a contact pad associated therewith and said column wire has a contact pad associated therewith on said circuit board, said contact bridge having two contact surfaces respectively disposed above said contact pads, said contact surfaces being interconnected by said diode.

3. The improvement of claim 2 wherein said contact bridge is a monolithically integrated circuit and wherein said contact bridge is mounted on an insulating carrier plate.

4. The improvement of claim 2 wherein said contact surfaces each comprise a flat cubic member of conductive material having respective end faces in registry with said contact pads, said diode being a housing-free diode interconnected between said cubic members.

5. The improvement of claim 2 wherein said contact surfaces are semicircular in shape and are respectively mounted on spacers interconnecting said diode with axial connecting wires.

6. The improvement of claim 2 wherein said contact bridge has an insulating material plate having two oppositely disposed edges respectively surrounded by U-shaped contact bars, each contact bar having a lower leg forming said contact surfaces, and each contact bar having an upper leg connected to said diode, and wherein said diode is a diode of the type utilized in film circuits.

7. The improvement of claim 2 wherein said contact surfaces are two respective metal plates, said diode having axial connecting wires to which said metal plates are welded.

* * * * *